(12) United States Patent
Yang (10) Patent No.: US 8,299,488 B2
(45) Date of Patent: Oct. 30, 2012

(54) LED CHIP

(75) Inventor: Wen-Kun Yang, Hsinchu (TW)

(73) Assignee: King Dragon International Inc., Tortola (VG)

( * ) Notice: Subject to any disclaimer, the term of this patent is extended or adjusted under 35 U.S.C. 154(b) by 61 days.

(21) Appl. No.: 12/970,194

(22) Filed: Dec. 16, 2010

(65) Prior Publication Data

US 2012/0153299 A1   Jun. 21, 2012

(51) Int. Cl.
 *H01L 33/00* (2010.01)
(52) U.S. Cl. ............ 257/98; 257/E33.035; 257/E33.068
(58) Field of Classification Search .................... 257/98, 257/E33.035, E33.068
See application file for complete search history.

(56) References Cited

U.S. PATENT DOCUMENTS

2011/0014734 A1*   1/2011   Lu .................................. 438/29
* cited by examiner

*Primary Examiner* — Kimberly Rizkallah
*Assistant Examiner* — Marvin Payen
(74) *Attorney, Agent, or Firm* — Shimokaji & Associates P.C.

(57) ABSTRACT

The present invention provides a LED chip structure. The LED chip structure comprises a substrate and an N type layer disposed on the substrate; a P type layer disposed on the N type layer; a N type contact pad and a P type contact pad disposed below the substrate; conductive through holes disposed through the substrate to electrically connect the N type layer to the N type contact pad and the P type layer to the conduct heat generated by the P type layer and the N type layer downward.

9 Claims, 7 Drawing Sheets

LED CHIP

FIELD OF THE INVENTION

The present invention relates to LED, and more particularly to the structure of a LED chip.

BACKGROUND OF THE INVENTION

Figure 1:
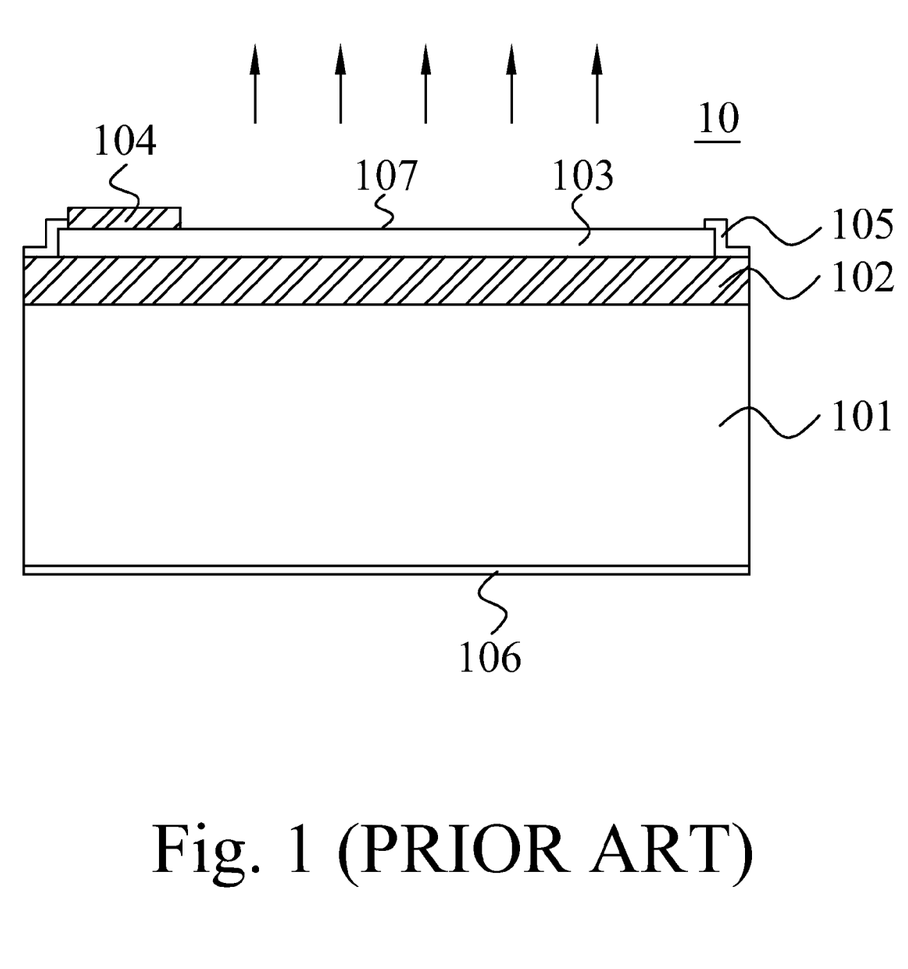
FIG. 1 illustrates a conventional LED chip.

Light emitting diodes (LEDs) are expected to the source of light for the next generation lighting which will replace incandescent bulbs and fluorescent lights. One conventional LED chip is illustrated in FIG. 1. The convention LED chip 10 includes a substrate 101. A P type layer 102 is formed on the substrate 101, and an N type layer 103 is further formed on the P type layer 102. Then, a passivation layer 105 is formed on two ends of the N type layer 103, and an N type contact pad 104 is formed on the N type layer 103. A terminal contact 106 is formed below the substrate 101. Therefore, the emitting surface 107 is formed on the upper surface of the N type layer 103.

Figure 2:
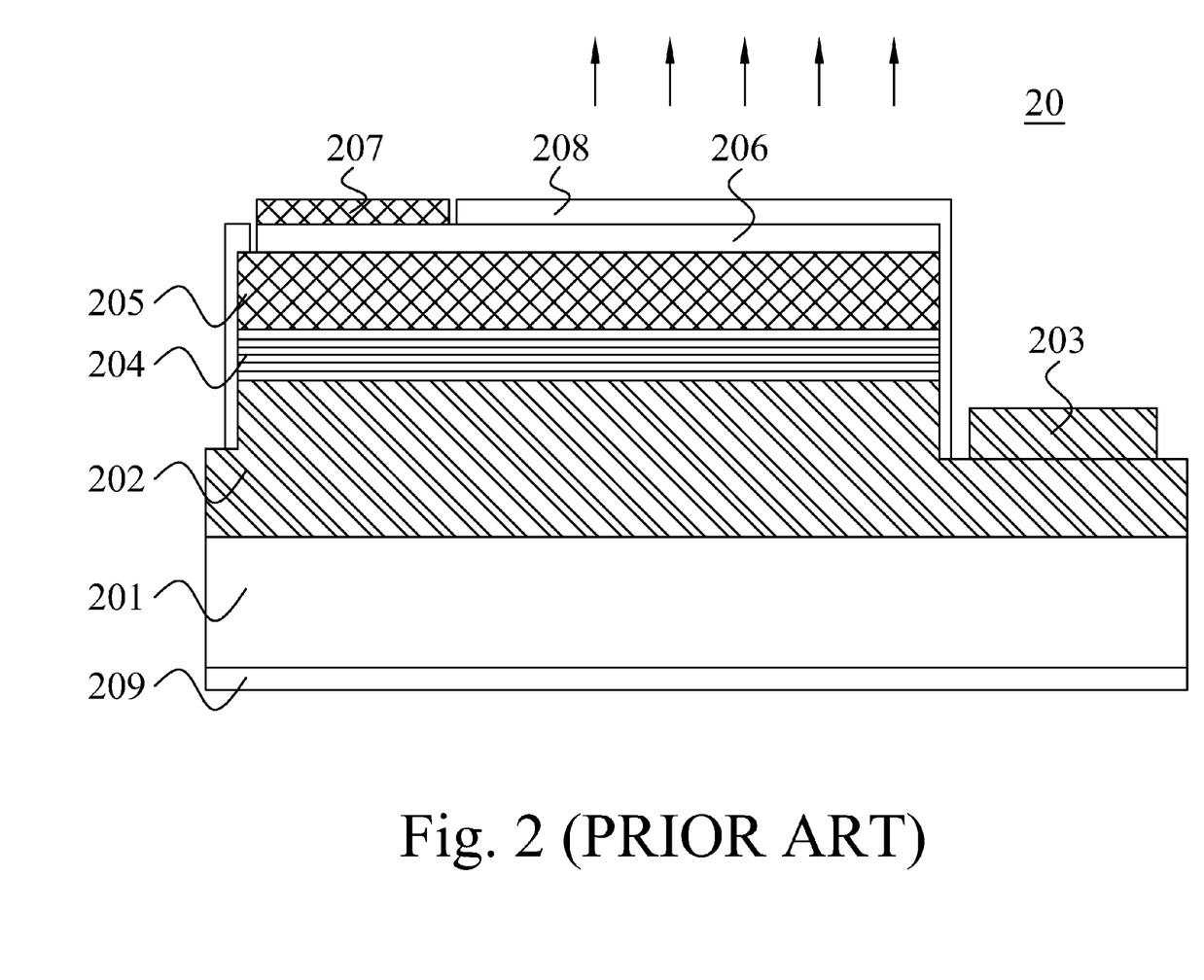
FIG. 2 illustrates another conventional LED chip.

Another conventional LED chip is illustrated in FIG. 2. The convention LED chip 20 includes a substrate 201 (for example made of sapphire). An N type layer 202 is formed on the substrate 201 while a reflector 209 is formed below the substrate 201. An N type contact pad 203 and a P type layer 205 are formed on the N type layer 202, such that a light emitting layer 204 is formed between the N type layer 202 and the P type layer 205. A transparent contact layer 206 is formed on the P type layer 205, and a P type contact pad 207 is formed on transparent contact layer 206. Furthermore, a protection layer 208 covers the outer surface of the N type layer 202, the P type layer 205, the light emitting layer 204 and the transparent contact layer 206 except the P type contact pad 207.

The aforementioned conventional LED chips still suffer some problems. For example, the contact pads 104 and 207 on the LED chips reduce the light emitting area and the light output, and the heat generated in the PN junction cannot be conducted outwards. Accordingly, there is still a need for a new LED chip to solve aforementioned problems.

SUMMARY OF THE INVENTION

To solve the aforementioned problems of the conventional LED chips, the present invention provides a new LED chip structure.

A LED chip structure comprises a substrate and first type semiconductor layer disposed on the substrate; a second type semiconductor layer disposed on the first type semiconductor layer; a first type semiconductor contact pad and a second type semiconductor contact pad disposed below the substrate; conductive through holes disposed through the substrate to electrically connect the first type semiconductor layer to the first type semiconductor contact pad and the second type semiconductor layer to the second type semiconductor contact pad respectively; and a thermal pad disposed below the substrate to conduct heat generated by the first type semiconductor layer and the second type semiconductor layer.

In another embodiment, A LED chip structure comprises a substrate and a first type semiconductor layer disposed on the substrate; a second type semiconductor layer disposed on the first type semiconductor layer; a reflection layer formed on the second type semiconductor layer; a passivation layer disposed on the reflection layer; a first type semiconductor contact pad connected to the first type semiconductor layer, and a second type semiconductor contact pad connected to the second type semiconductor layer; and a thermal pad disposed on the passivation layer to conduct heat generated by the first type semiconductor layer and the second type semiconductor layer.

Alternatively, a LED chip structure comprises a substrate and a first type semiconductor layer disposed on the substrate; a second type semiconductor layer disposed on the first type semiconductor layer; a second type semiconductor contact pad disposed on the second type semiconductor layer; a terminal contact disposed below the substrate, and a dielectric layer and a first type semiconductor contact pad disposed below the terminal contact; a thermal pad disposed below the dielectric layer to conduct heat generated by the first type semiconductor layer and the second type semiconductor layer.

In one detailed aspect, the present invention provides a normal type LED chip structure. The LED chip structure comprises a substrate and an N type layer disposed on the substrate; a P type layer disposed on the N type layer; a N type contact pad and a P type contact pad disposed below the substrate; conductive through holes disposed through the substrate to electrically connect the N type layer to the N type contact pad and the P type layer to the P type contact pad respectively; and a thermal pad disposed below the substrate to conduct heat generated by the P type layer and the N type layer downwards.

In another aspect, the present invention provides a flip chip type LED chip structure. The LED chip structure comprises a substrate and a first N type layer disposed on the substrate; a first P type layer and a second N type layer disposed on the first N type layer; a second P type layer and a passivation layer disposed on the first P type layer; a N type contact pad disposed on the second N type layer and the passivation layer, and a P type contact pad disposed on the second P type layer and the passivation layer; and a thermal pad disposed on the passivation layer to conduct heat generated by the first P type layer, the first N type layer and the second N type layer upwards.

In still another aspect, the present invention provides a normal type LED chip structure. The LED chip structure comprises a substrate and a P type layer disposed on the substrate; a N type layer disposed on the P type layer; a N type contact pad disposed on the N type layer; a terminal contact disposed below the substrate, and a dielectric layer and a P type contact pad disposed below the terminal contact; a thermal pad disposed below the dielectric layer to conduct heat generated by the P type layer and the N type layer downwards.

One advantage of the present invention is that the heat generated in the PN junction can be conducted outwards quickly through the thermal pad.

Another advantage of the present invention is that the light emitting area and the light output of the LED chip will be increased.

Still another advantage of the present invention is that the thermal pad can be isolated from the N type or P type contact pad to achieve ESD protection.

These and other advantages will become apparent from the following description of preferred embodiments taken together with the accompanying drawings and the appended claims.

BRIEF DESCRIPTION OF THE DRAWINGS

The present invention may be understood by some preferred embodiments and detailed descriptions in the specification and the attached drawings below. The identical reference numbers in the drawings refer to the same components in the present invention. However, it should be appreciated that all the preferred embodiments of the invention are provided only for illustrating but not for limiting the scope of the Claims and wherein:

DETAILED DESCRIPTION OF THE PREFERRED EMBODIMENT

The invention will now be described with the preferred embodiments and aspects and these descriptions interpret structure and procedures of the invention only for illustrating but not for limiting the Claims of the invention. Therefore, except the preferred embodiments in the specification, the present invention may also be widely used in other embodiments.

Figure 3:
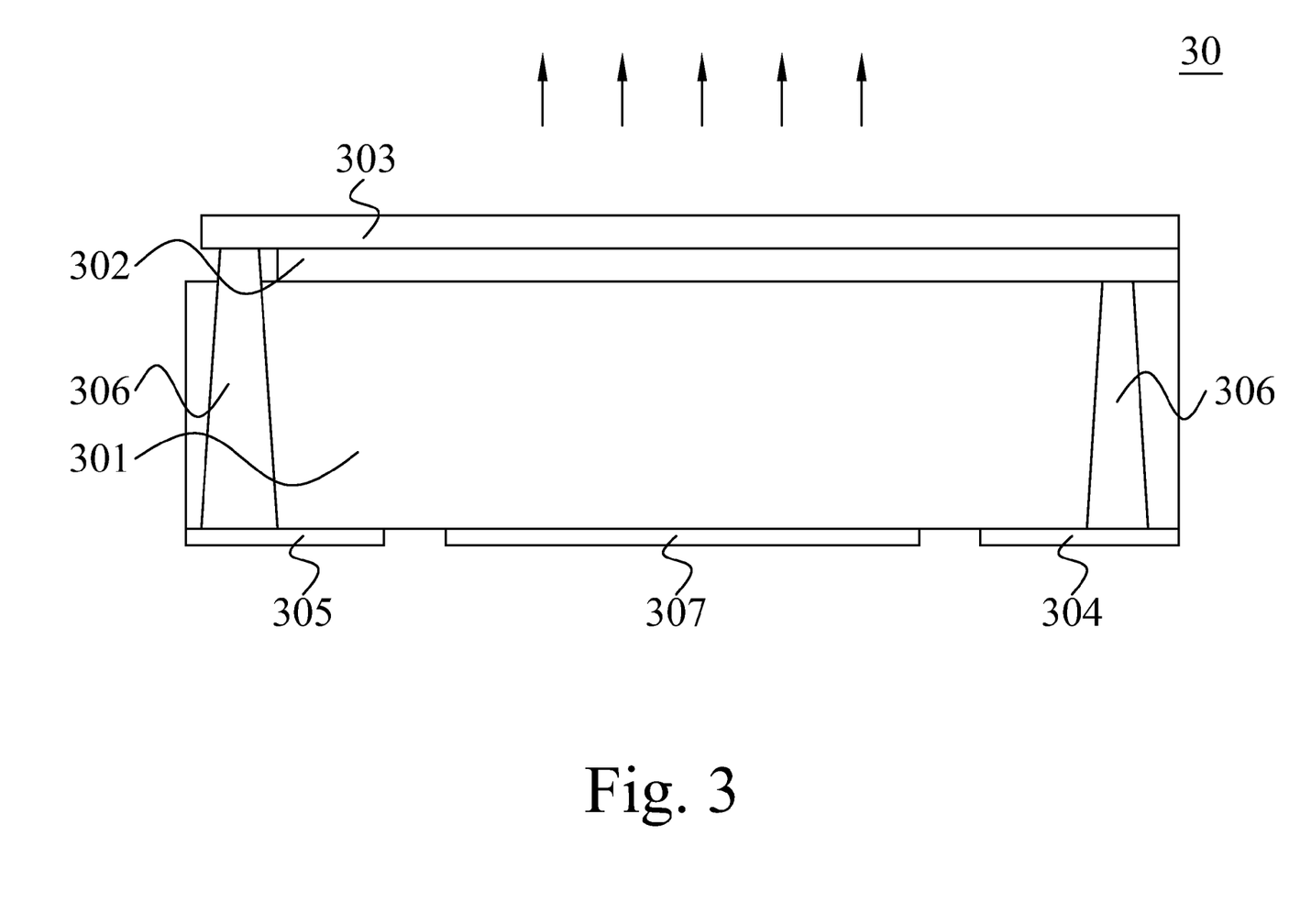
FIG. 3 illustrates a normal type LED chip in accordance with one embodiment of the present invention.

The present invention discloses a light emitting diode (LED) chip. FIG. 3 illustrates a normal type LED chip. With reference to FIG. 3, in one embodiment of the present invention, the LED chip 30 includes a substrate 301, a first type semiconductor layer, for example, an N type layer 302 disposed on the substrate 301, and a second type semiconductor layer, for example, P type layer 303 disposed on the N type layer 302. The type of the layers may be changeable. The width of the upper layer, in the embodiment the P type layer 303 is substantially longer than that of the lower layer, in the case, the N type layer 302. In one embodiment of the present invention, the material of the substrate 301 may be ceramic, glass, sapphire or any other non-electrically conductive substrate material with high heat conductivity. Preferably, the material of the substrate 301 may be aluminum nitride (AlN). A first type contact pad, such as an N type contact pad 304 and a second type contact pad, such as a P type contact pad 305 are disposed below the substrate 301. In one embodiment, the N type contact pad 304 and the P type contact pad 305 can be formed by using re-distribution method.

Conductive through holes 306 are disposed through the substrate 301 and respectively on the N type contact pad 304 and the P type contact pad 305, and are filled with conductive materials to electrically connect the N type layer 302 to the N type contact pad 304 and the P type layer 303 to the P type contact pad 305 respectively. In one embodiment of the present invention, the conductive through holes 306 can be formed by utilizing TSV (Through-Silicon Via) method, for example the etching method or the laser drilling method, or the mechanical drilling method. A thermal pad 307 is disposed below the substrate 301 in the area except the N type contact pad 304 and the P type contact pad 305. In one embodiment, the material of the thermal pad 307 may be metal. In one embodiment, the thermal pad 307 can be formed by using re-distribution method. Conductive materials are filled in the conductive through hole 306 on the P type contact pad 305 and are further formed over the upper surface of the substrate 301 to connect the P type layer 303. Therefore, the N type and P type contact pads 304, 305 are disposed on the lower surface of the substrate 301, which is opposite to the light emitting surface, i.e. the upper surface of the LED chip 30. The light emitted from the LED chip 30 will not be blocked by the N type and P type contact pads 304, 305. The light emitting area and the light output of the LED chip 30 will be increased. Consequently, the light-emitting efficiency is greatly improved. Moreover, the heat generated in the PN junction, i.e. the area in which the P type layer 303 contacts the N type layer 302, can be conducted downwards quickly through the heat conductive substrate 301 and the thermal pad 307. Furthermore, the thermal pad 307 is isolated from the N type contact pad 304 and the P type contact pad 305 by the non-electrically conductive substrate 301, thereby ESD protection can be achieved.

Figure 4:
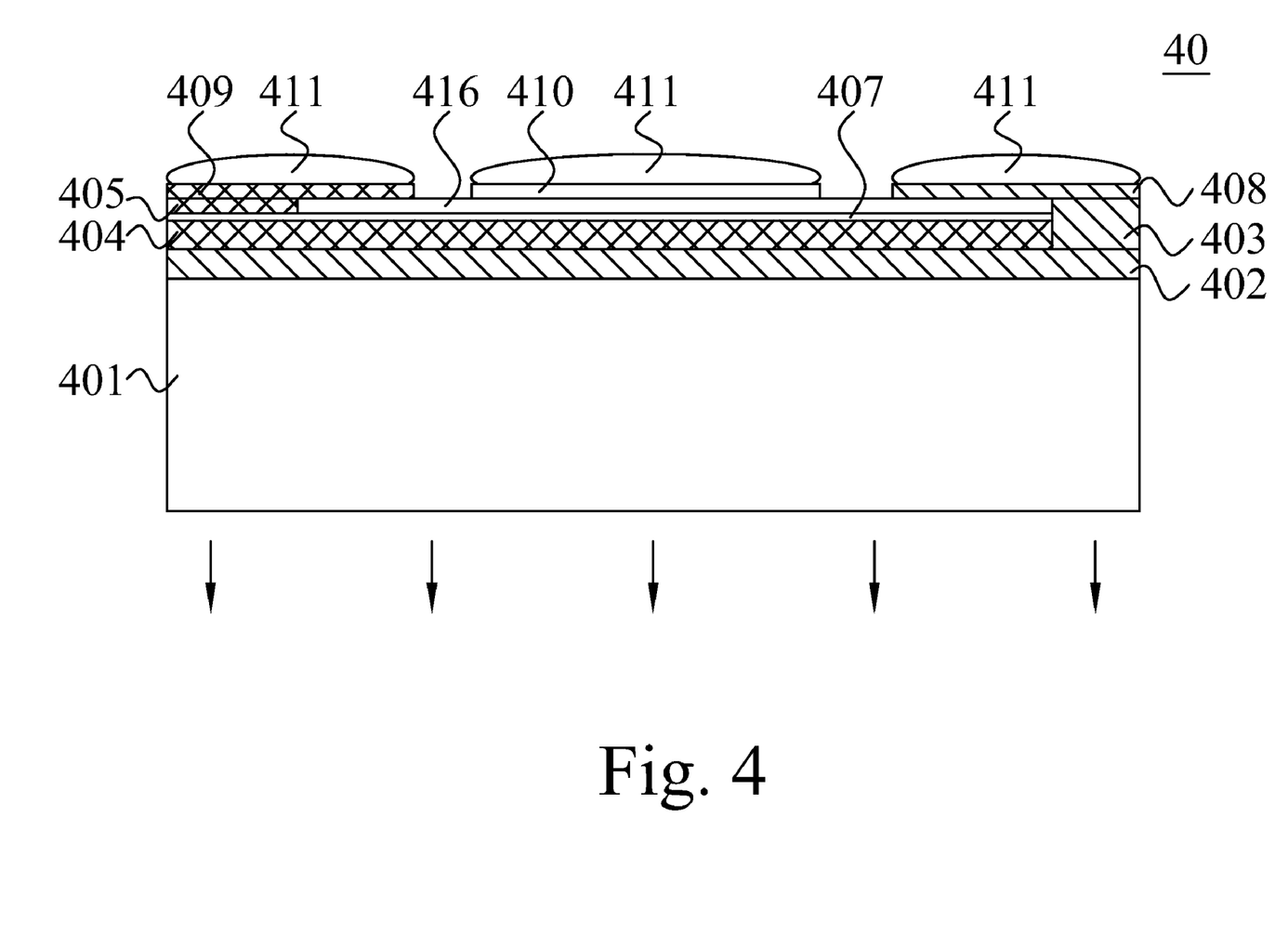
FIG. 4 illustrates a flip chip type LED chip in accordance with another embodiment of the present invention.

FIG. 4 illustrates a flip chip type LED chip. With reference to FIG. 4, in another embodiment of the present invention, the LED chip 40 includes a substrate 401 and a first type semiconductor layer, for example, a N type layer 402 disposed on the substrate 401. In one embodiment of the present invention, the material of the substrate 301 may be glass, sapphire, etc. A second type semiconductor layer, in the case, a P type layer 404 and a first type connection layer, in the case, an N type connection layer 403 are disposed on the N type layer 402. As aforementioned, the layers 402, 404 are changeable. Further, a reflecting layer 407 is disposed on the P type layer 404, and a second type connection layer, for example, a P type connection layer 405 and a passivation layer 416 are disposed on the reflecting layer 407. In one embodiment, the material of the passivation layer 416 may be silicon dioxide, silicon nitride or silicon oxynitride. The material of the reflecting layer 407 may be metal or alloy.

A first type semiconductor contact pad, in the case, an N type contact pad 408 is disposed over the N type layer 402 via the N type connection layer 403 and on the passivation layer 416, and a second type semiconductor contact pad, in the case, a P type contact pad 409 is disposed on the P type connection layer 405 and the passivation layer 416. The types of the contact pads are switchable. A thermal pad 410 is disposed on the passivation layer 416. In one embodiment of the present invention, the material of the thermal pad 410 may be metal or alloy. In one embodiment, the N type contact pad 408, the P type contact pad 409 and the thermal pad 410 can be formed by using re-distribution method. Moreover, solder bumps 411 are disposed respectively on the N type contact pad 408, the P type contact pad 409 and the thermal pad 410. Therefore, the N type and P type contact pads 408, 409 are disposed on the upper surface of the LED chip 40, which is opposite to the light emitting surface, i.e. the lower surface of the substrate 401. The light emitted from the LED chip 40 will not be blocked by the N type and P type contact pads 408, 409. The light emitting area and the light-emitting efficiency of the LED chip 40 will be increased. Moreover, the heat generated in the PN junction, i.e. the area in which the first P type layer 404 contacts the first N type layer 402 and the second N type layer 403, can be conducted upwards quickly through the thermal pad 410. Furthermore, the thermal pad 410 is isolated from the N type contact pad 408 and the P type contact pad 409 by the passivation layer 416, thereby short-circuit protection can be achieved.

Figure 5:
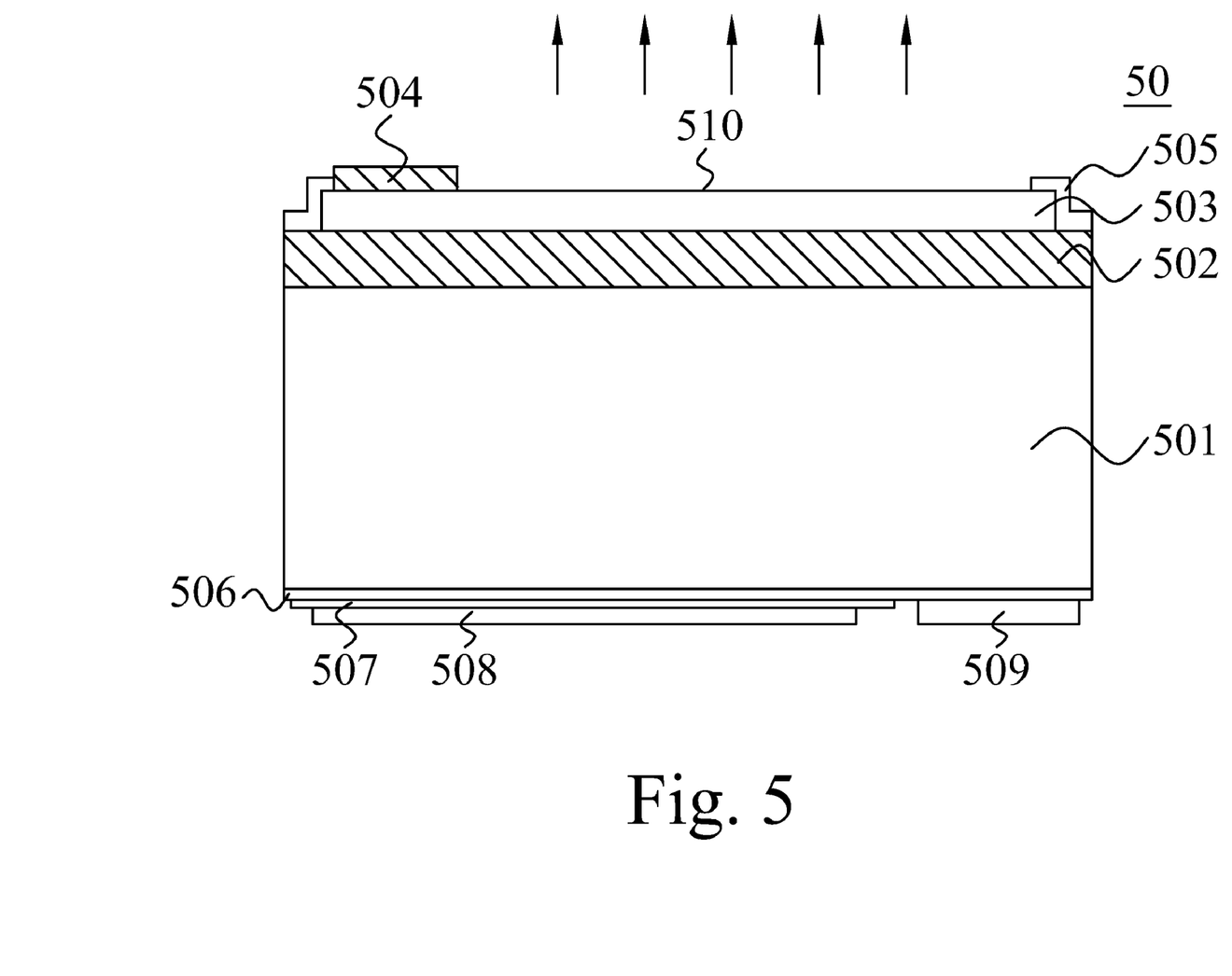
FIG. 5 illustrates another normal type LED chip in accordance with still another embodiment of the present invention.

FIG. 5 illustrates another normal type LED chip. As aforementioned, the types of the semiconductor layers and contact pads are also changeable. With reference to FIG. 5, in still another embodiment of the present invention, the LED chip 50 includes a substrate 501 and a P type layer 502 disposed on the substrate 501. In one embodiment, the material of the substrate 501 may be silicon carbon (SiC) or any other p type material with high heat conductivity. In one embodiment, the material of the P type layer 502 may be metal. An N type layer 503 is disposed on the P type layer 502 while an N type contact pad 504 is disposed on the N type layer 503. In one embodiment, the material of the N type layer 503 may be indium gallium nitride (InGaN). A passivation layer 505 is disposed on two ends of the N type layer 503. Further, a terminal contact 506 is disposed below the substrate 501. The material of the terminal contact 506 may be aurum (Au) or alloy.

A thin film type dielectric layer 507 and a P type contact pad 509 are disposed below the terminal contact 506, and a thermal pad 508 is further disposed below the dielectric layer 507. In one embodiment, the thickness of the thin film type dielectric layer 507 may be about 1 μm and it is preferred as thin as better. In one embodiment, the material of the thin film type dielectric layer 507 may be polyimide (PI), benzocyclobutene (BCB), silicon dioxide (SiO$_2$), silicon nitride (SiN), etc. In one embodiment of the present invention, the material of the thermal pad 410 may be metal. In one embodiment of the present invention, the terminal contact 506, the thin film type dielectric layer 507, the thermal pad 508 and the P type contact pad 509 can be formed by using re-distribution method. Therefore, the heat generated in the PN junction, i.e. the area in which the P type layer 502 contacts the N type layer 503, can be conducted downwards quickly through the heat conductive substrate 501, the terminal contact 506 and the thermal pad 508. The heat conducting rate will not be decreased because the dielectric layer 507 is thin film type. Furthermore, the thermal pad 508 is isolated from the N type contact pad 504 and the P type contact pad 509 by the thin film type dielectric layer 507, thereby ESD protection can be achieved.

Figure 6:
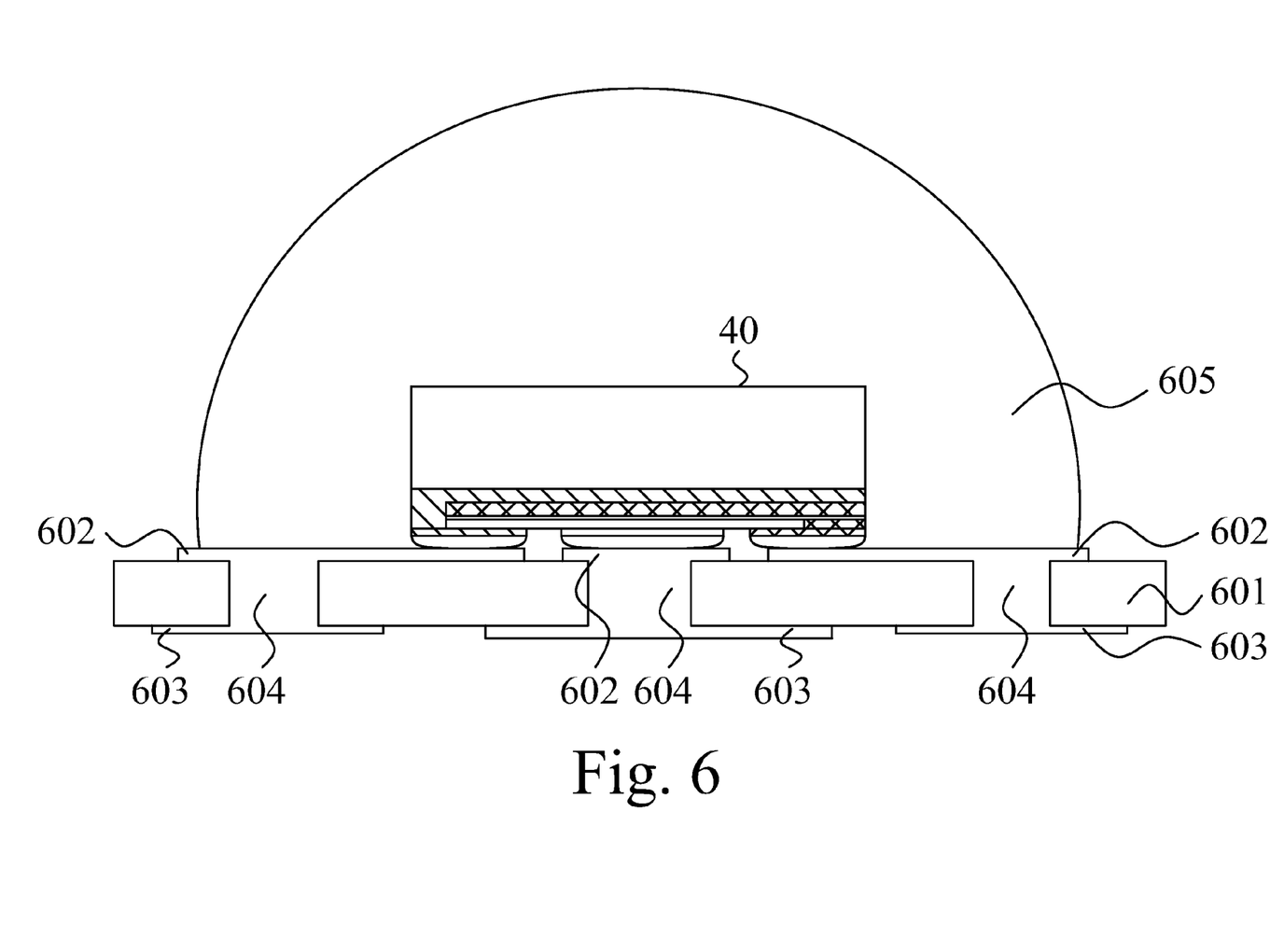
FIG. 6 illustrates a LED package structure in accordance with one embodiment of the present invention.

In one embodiment, when the LED chip of the present invention is packaged in a LED package, the thermal pad of the LED chip may directly contact metal on an external substrate to increase heat conductivity. In another embodiment, if solder bumps are disposed on the thermal pad, the solder bumps may directly contact metal on the external substrate. For example, FIG. 6 illustrates a LED package structure in accordance with one embodiment of the present invention. As shown in FIG. 6, an external substrate 601 includes a plurality of through holes 604, a plurality of upper contact pads 602 and a plurality of lower contact pads 603. The through holes 604 are filled with conductive materials to electrically connect the upper contact pads 602 and the lower contact pads 603. A microlens 605 is disposed on the LED chip 40 and the upper contact pads 602 of the external substrate 601. The solder bumps on the thermal pads in the LED chip 40 directly contact the upper contact pads 602 to conductively couple with the lower contact pads 603 through the through holes 604.

Figure 7:
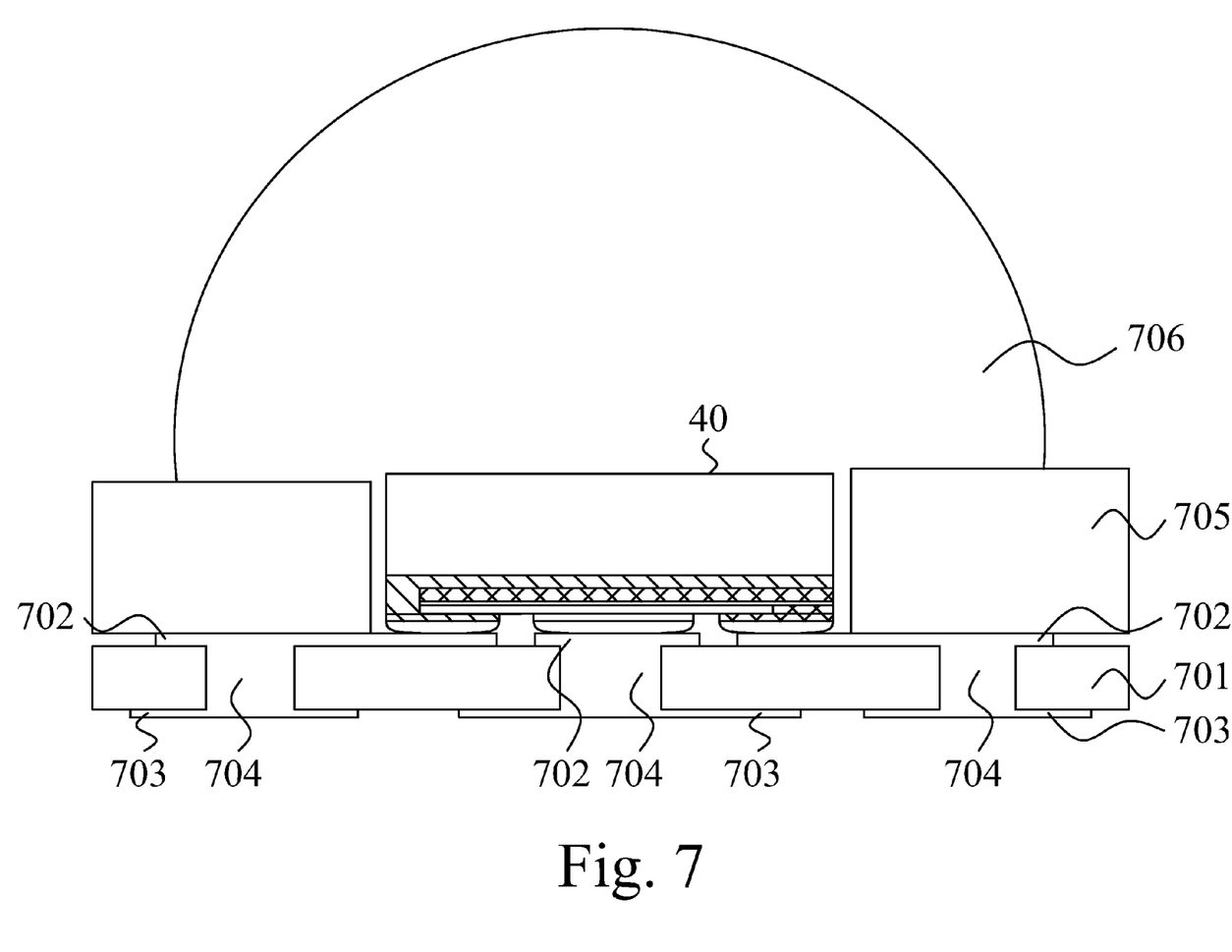
FIG. 7 illustrates another LED package structure with white substrate in accordance with another embodiment of the present invention.

FIG. 7 illustrates another LED package structure with white substrate in accordance with another embodiment of the present invention. As shown in FIG. 7, an external substrate 701 includes a plurality of through holes 704, a plurality of upper contact pads 702 and a plurality of lower contact pads 703. The through holes 704 are filled with conductive materials to electrically connect the upper contact pads 702 and the lower contact pads 703. An upper external substrate 705 is disposed on the external substrate 701. A microlens 706 is disposed on the LED chip 40 and the upper external substrate 705. The solder bumps on the thermal pads in the LED chip 40 directly contact the upper contact pads 702 to electrically couple with the lower contact pads 703 through the through holes 704. The material of the upper external substrate 705 may be white BT (bismaleimide triazine) and the upper external substrate 705 surrounds the LED chip 40 as shown in FIG. 7, such that the light emitted from the LED chip 40 may be reflected by the substrate 705 made of white BT and the mechanical support of the LED package can be enhanced.

The foregoing description is a preferred embodiment of the present invention. It should be appreciated that this embodiment is described for purposes of illustration only, not for limiting, and that numerous alterations and modifications may be practiced by those skilled in the art without departing from the spirit and scope of the invention. It is intended that all such modifications and alterations are included insofar as they come within the scope of the invention as claimed or the equivalents thereof.

What is claimed is:

1. A LED chip structure, comprising:
    a substrate and a first type semiconductor layer disposed on said substrate;
    a second type semiconductor layer disposed on said first type semiconductor layer;
    a reflection layer directly formed on said second type semiconductor layer;
    a passivation layer disposed on said reflection layer;
    a first type semiconductor contact pad connected to said first type semiconductor layer, and a second type semiconductor contact pad connected to said second type semiconductor layer; and
    a thermal pad disposed on said passivation layer to conduct heat generated by said first type semiconductor layer and said second type semiconductor layer, wherein said passivation layer electrically isolates said thermal pad from said reflection layer and said second type semiconductor layer.

2. The structure of claim 1, wherein material of said substrate comprises glass or sapphire.

3. The structure of claim 1, wherein material of said passivation layer comprises silicon dioxide or silicon nitride.

4. The structure of claim 1, wherein material of said thermal pad comprises metal.

5. The structure of claim 1, wherein material of said reflecting layer comprises metal or alloy.

6. A LED chip structure, comprising:
    a substrate and a first type semiconductor layer disposed on said substrate;
    a second type semiconductor layer disposed on said first type semiconductor layer;
    a reflection layer formed on said second type semiconductor layer;
    a passivation layer disposed on said reflection layer;
    a first type semiconductor contact pad connected to said first type semiconductor layer, and a second type semiconductor contact pad connected to said second type semiconductor layer;
    a thermal pad disposed on said passivation layer to conduct heat generated by said first type semiconductor layer and said second type semiconductor layer; and
    solder bumps disposed on said first type semiconductor contact pad, said second type semiconductor contact pad and said thermal pad.

7. The structure of claim 6, wherein said solder bumps contact a plurality of contact pads on an external substrate.

8. The structure of claim 7, wherein material of said external substrate comprises white BT (bismaleimide triazine).

9. The structure of claim 7, wherein said external substrate surrounds said LED chip structure.

* * * * *